United States Patent [19]

Matsushita et al.

[11] 4,378,269

[45] Mar. 29, 1983

[54] METHOD OF MANUFACTURING A SINGLE CRYSTAL SILICON ROD

[75] Inventors: Yoshiaki Matsushita; Shinichiro Takasu, both of Tokyo; Seigo Kishino, Hachioji, all of Japan

[73] Assignee: VLSI Technology Research Association, Japan

[21] Appl. No.: 276,940

[22] Filed: Jun. 24, 1981

Related U.S. Application Data

[63] Continuation of Ser. No. 83,800, Oct. 11, 1979, abandoned.

[30] Foreign Application Priority Data

Oct. 17, 1978 [JP] Japan ................................. 53-127580

[51] Int. Cl.³ ............................................. C30B 15/20
[52] U.S. Cl. ...................... 156/617 SP; 156/DIG. 73
[58] Field of Search ............... 156/DIG. 73, DIG. 64, 156/617 SP; 148/172

[56] References Cited

U.S. PATENT DOCUMENTS 3,192,082  6/1965  Tomono et al. .............. 156/617 SP
3,441,385  4/1969  Schmidt ....................... 156/DIG. 64
4,140,570  2/1979  Voltmer et al. ............. 156/DIG. 73

*Primary Examiner*—Hiram Bernstein
*Attorney, Agent, or Firm*—Finnegan, Henderson, Farabow, Garrett & Dunner

[57] ABSTRACT

A method of manufacturing a single crystal silicon rod by the pulling method which is characterized in that the intracrystal temperature of the growing single crystal silicon rod is reduced from 900° to 500° C. in less than 4 hours.

2 Claims, 6 Drawing Figures

F I G. 1
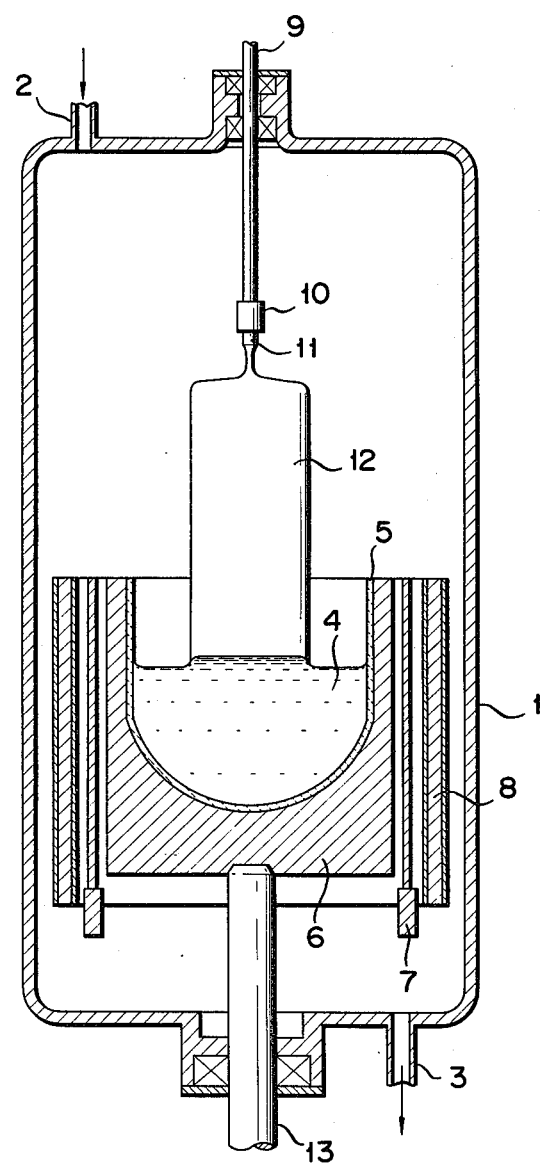

METHOD OF MANUFACTURING A SINGLE CRYSTAL SILICON ROD

This is a continuation of application Ser. No. 083,800 filed Oct. 11, 1979, now abandoned.

BACKGROUND OF THE INVENTION

This invention relates to a method of manufacturing a large size single crystal silicon rod from a silicon melt in a protective atmosphere by the pulling method or Czochraski method and an apparatus for said method.

The prior art apparatus for manufacturing a single crystal silicon rod by the pulling method is constructed roughly as shown in FIG. 1. Reference numeral 1 denotes a vessel provided with an inlet 2 of protective gas and and outlet 3 thereof. A quartz crucible 5 in which a silicon melt 4 is to be produced is set in the vessel 1. The quartz crucible 5 is supported by a holding member 6 made of graphite placed around the holding member 6 is a graphite heater 7. Provided further outside of the graphite heater 7 is a heat-insulating member 8 made of, for example, graphite felt. Reference numeral 9 denotes a pulling bar, the inner end of which holds a seed silicon crystal 11 by means of a fixing device 10. A single crystal silicon rod 12 is produced by dipping the seed silicon crystal 11 in the silicon melt 4 and pulling said seed silicon crystal 11 out of said melt 4 with the temperature and the speed at which the seed silicon crystal 11 is to be pulled up controlled to the desired level. Reference numeral 13 represents a shaft for rotating the quartz crucible 5. While the seed silicon crystal 11 is pulled up, the rotation of the quartz crucible 5 by the shaft 13 is controlled to such speed as produces a single crystal silicon rod of uniform quality.

A substantially dislocation-free single crystal silicon wafer is generally manufactured by heating a single crystal silicon rod grown in the apparatus of FIG. 1 at a temperature of 600° to 700° C. for about one hour, followed by quenching and forming the produced single crystal silicon rod into a wafer having a thickness of 300 to 650 microns by machining and chemical etching.

The dislocation density of a single crystal silicon wafer is indicated by counting a number of pits appearing as the result of chemical etching by means of an optical microscope. In general, a thin single crystal silicon wafer whose polished surface contains 500 or fewer etch pits per $cm^2$ is referred to as a dislocation-free product.

Even with the so-called dislocation-free single crystal silicon wafer, it is experimentally shown that while heat treatment is repeated several times at a temperature of 800° to 1200° C. during the manufacture of a semiconductor element, various lattice defects including the dislocation thereof take place in silicon crystal, resulting in a decrease in the yield of a semiconductor device. It has been discovered that with the same type of dislocation-free single crystal silicon product, lattice defects appear prominently or substantially unnoticeably during the manufacture of a semiconductor device, depending on the condition in which the preceding single crystal silicon rod is grown.

SUMMARY OF THE INVENTION

This invention is intended to provide a method of manufacturing a single crystal silicon rod having such high quality as prevents the occurrence of lattice defects during the heat treatments repeated to produce a semiconductor device, and an apparatus for said method.

According to an aspect of this invention, there is provided a method of manufacturing a single crystal silicon rod by dipping a seed silicon crystal in a silicon melt and pulling the seed silicon crystal therefrom in an atmosphere of protective gas, which is characterized in that the intracrystal temperature of the single crystal silicon rod is reduced from 900° to 500° C. in less than 4 hours.

According to another aspect of this invention, there is provided an apparatus adapted to apply the method of manufacturing a single crystal silicon rod, which comprises:

a crucible which is received in a vessel through which a protective gas flows and used to hold a silicon melt;

heating means disposed around the crucible for its heating;

means for rotating the crucible; and means for pulling up the seed silicon crystal contacted by the silicon melt;

and is further characterized in that radiant heat-shielding means is provided in the vessel to prevent heat radiated from the high temperature zones of the apparatus from being transmitted to a growing single crystal silicon rod, thereby causing the intracrystal temperature of the growing single crystal silicon rod to be reduced from 900° to 500° C. in less than 4 hours. For the object of this invention, it is possible to replace the above-mentioned radiant heat-shielding means by cooling means around a growing single crystal silicon rod. Alternatively, both cooling means and radiant heat-shielding means may be applied at the same time.

BRIEF DESCRIPTION OF THE DRAWING

FIG. 1 is a sectional view of a prior art apparatus for manufacturing a single crystal silicon rod;

DETAILED DESCRIPTION OF THE INVENTION

There will now be described a single crystal silicon rod-manufacturing method embodying this invention and an apparatus for said method by reference to the accompanying experimental data.

Figure 2:
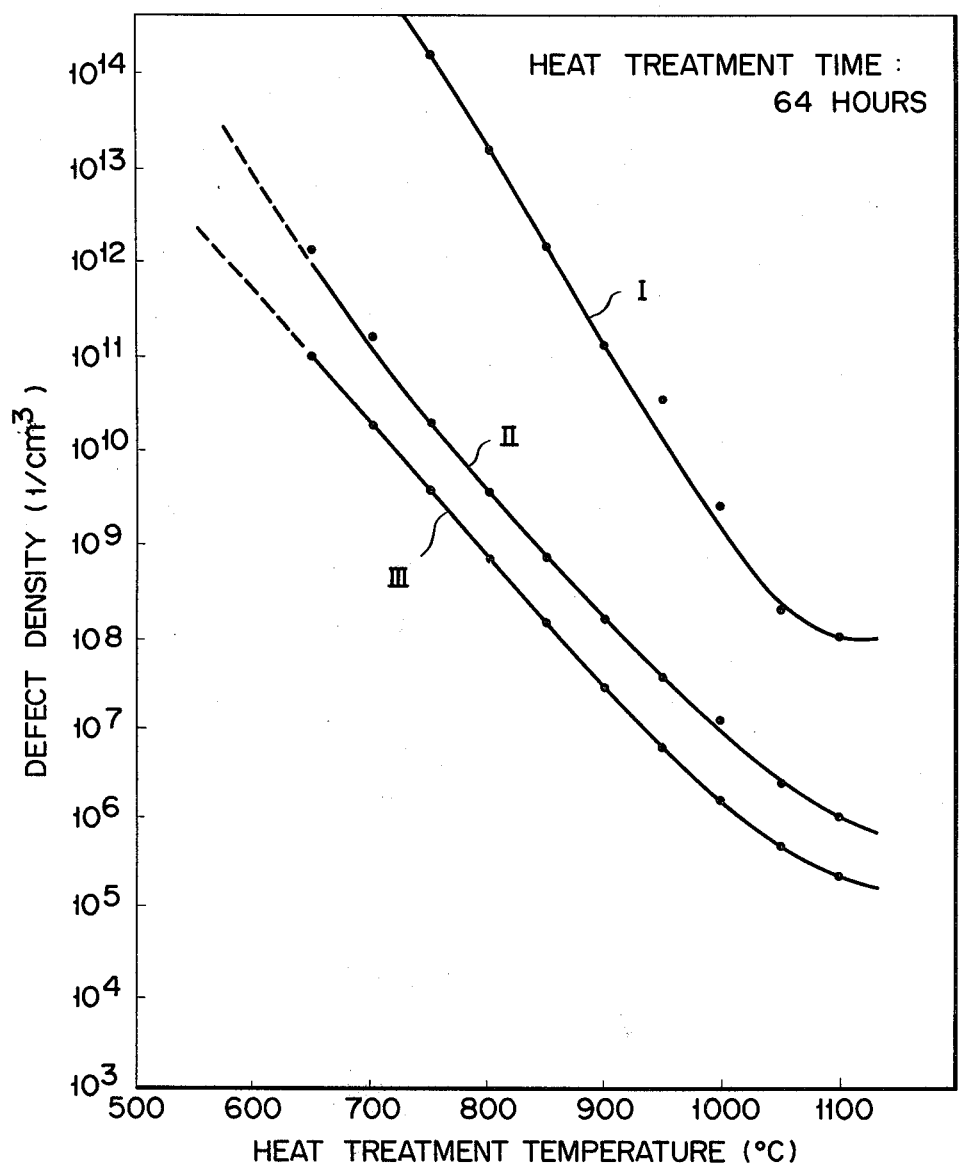
FIGS. 2 to 5 graphically indicate data of experiments carried out to define the conditions for manufacturing a single crystal silicon rod in accordance with the method of this invention and also to make sure of the function and effect of said manufacturing method.

FIG. 2 indicates the results of measuring lattice defects occurring in heat-treated silicon wafers cut out of single crystal silicon rod produced under different manufacturing conditions. The temperature range from 500° to 1100° C. applied in the heat treatment was divided into substantially 50° C. sections. Heat treatment at all the 50° C. points was continued 64 hours. It was assumed that the density of lattice defects would vary with the content of an impurity in a wafer. To carry out experiments under the same conditions, therefore, only those of the wafer samples were selected through which impurities such as oxygen and carbon were respectively contained at substantially the same concentration as measured by the infrared absorption method. The interstitial oxygen concentration was chosen to be $(1\pm0.1)\times10^{18}/cm^3/$ and the substitutional carbon concentration was chosen to be less than $6 \times 10^{16}/cm^3$. The lattice defect density was measured in the following way. The cleaved surface of a heat treated wafer sample was etched 20 minutes by Dash etchant. (One part HF, three parts $HNO_3$) and about ten parts glascial acetic acid—see, Journal of Applied Physics Vol. 27, page 1193 (1956)). The etched plane was set at the gray contrast position of a Normarski interference microscope to be photographed at a magnification of 400 to 1000 times. Further, the etched cleaved surface was observed at a magnification of $50,000 \times$ to $150,000 \times$ by a high resolution scanning electron microscope with a field emission gun. Moreover, silicon sheets thinner than about 500 Å were made from the samples heat-treated at a temperature of 500° to 800° C. and observed by transmission electron microscope.

The samples I to III of FIG. 2 represent the single crystal silicon rods which were cooled at different rates during growth. The sample I denotes a single crystal silicon rod cooled at the customary rate. The samples II, III show single crystal silicon rods cooled at a rate 2 to 3 times greater than the customary cooling rate. Experimental data of FIG. 2 show that the density of lattice defects resulting from heat treatment largely depends on the rate at which a single crystal silicon rod is cooled during growth, in other words, a greater cooling rate than applied in the past reduces the occurrence of lattice defects.

Figure 3:
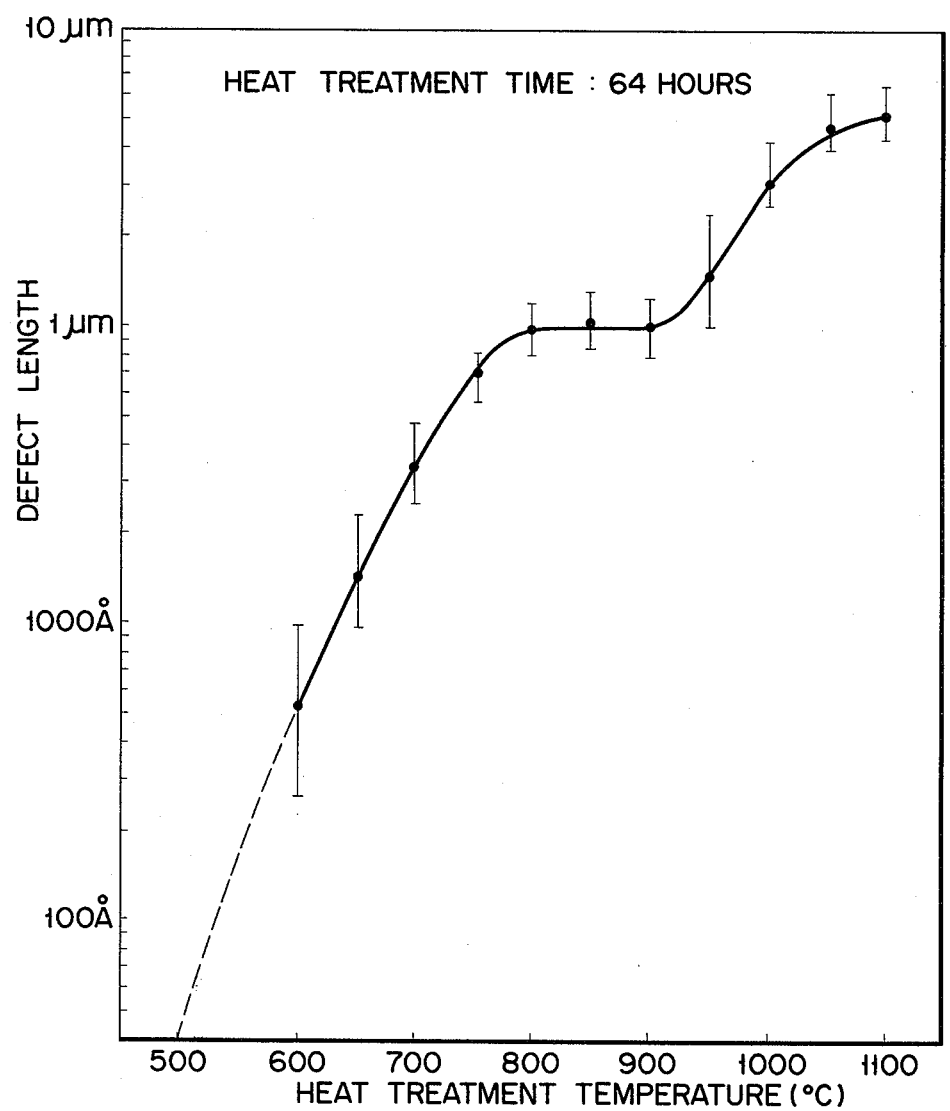

FIG. 3 indicates the size of lattice defects observed in the sample I of FIG. 2 at the respective temperatures of heat treatment. At a temperature of 600° C., the size of lattice defects indicated about 500 Å on the average. This level of lattice defects could not be observed by an optical microscope, but by the electron microscope. The size of lattice defects at said temperature of 500° C. were extrapolated to be 30 to 50 Å from data indicated in FIG. 3. With respect to silicon wafer samples heat treated at a temperature of 450° C. which were not investigated, the size of lattice defects was extrapolated to range between 6 and 9 Å.

It may be concluded from the close relationship between the size of lattice defects and the temperature of heat treatment that the stable lattice defects could be formed by a heat treatment at a higher temperature than 500° C., and even when a silicon wafer is long heat treated at a temperature lower than 500° C., the lattice defects formed by such condition only have a size which is limited within a unit cell of silicon lattice; and therefore said lattice defects cannot be stable in a silicon single crystal.

Figure 4:
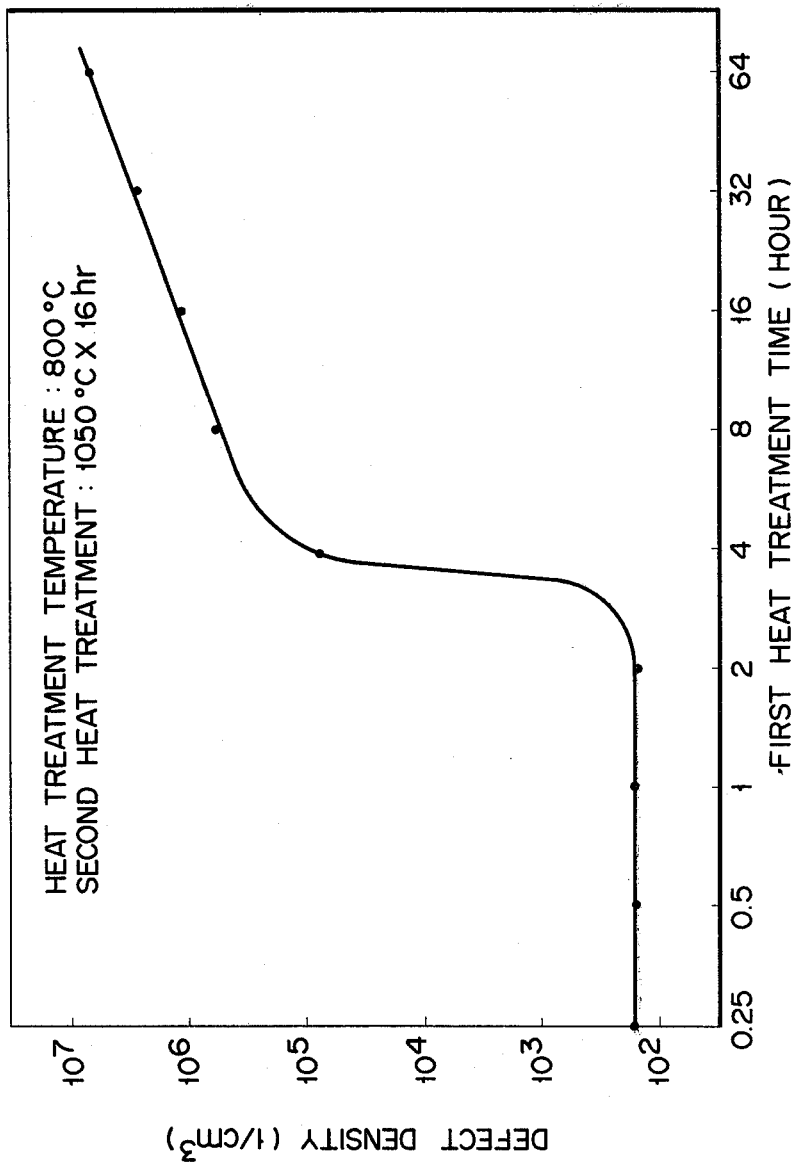

As mentioned above, a silicon wafer is heat treated a number of times at various levels of temperature ranging from 800° to 1200° C. during the manufacture of a semiconductor device. The generation of lattice defects by the heat treatment of semiconductor device process can be easily infered from the long heat treatment at a temperature of 1050° C. Then, single crystal silicon wafer samples prepared from the same type of single crystal silicon rod as the sample II of FIG. 2 were heat treated at 800° C. for various lengths of time ranging from 15 minutes to 64 hours, followed by quenching. All the silicon wafer samples were again heat treated 16 hours at 1050° C., followed by quenching. Measurement was made of lattice defects appearing on the surface of the silicon wafer samples, the results being set forth in FIG. 4. The noticeable aspect of FIG. 4 is that a sudden increase was observed in the density of lattice defects between a single crystal silicon wafer sample heat treated 2 hours at 800° C. in the first step and that heat treated 4 hours similarly at 800° C. in the first step.

As mentioned above, the noticeable occurrence of lattice defects largely depends on the temperature and duration of the first step heat treatment. What can be concluded from silicon wafer samples heat treated in the first step at different temperatures is that where the first step heat treatment was carried out longer than 4 hours at a temperature ranging between 900° and 500°, prominent lattice defects appeared when the second step heat treatment was conducted at a temperature of 1050° C. In other words, it has been disclosed that if the temperature of a single crystal silicon rod, a predecessor of a single crystal silicon wafer used in the manufacture of a semiconductor device, is so controlled as to progressively fall from 900° to 500° C. in less than 4 hours, then the prominent occurrence of lattice defects can be effectively suppressed in the manufacture of a silicon semiconductor device.

The steps in which a single crystal silicon mass is held at various levels of temperature ranging between 900° and 500° C. before a semiconductor device is produced from the original single crystal silicon rod grown from a silicon melt can be broadly divided as follows:

(1) a step of reducing the temperature of a grown single crystal silicon rod to room temperature;

(2) a step of eliminating an oxygen donor by holding a single crystal silicon rod at a temperature of generally 600° to 700° C. for about one hour; and (3) a step of introducing a single crystal silicon wafer into a furnace to produce a semiconductor device.

The present inventors measured lengths of time required for the above-mentioned steps (1), (2), (3) to be completed. With respect to the step (3), only 10 minutes were required for completion of each of a plurality of heat treatments carried out by raising the temperature from 500° to 900° C. With respect to the step (2), a length of time required to raise the temperature of a single crystal silicon wafer from 500° C. to the above-mentioned level of 600° to 700° C. and thereafter reduce said temperature level of 600° to 700° C. back to 500° C. totaled 1.5 to 2 hours.

In other words, even where a period of time in which a silicon mass is held at a temperature ranging between 500° and 900° C. during the steps (2) and (3) totals 3 hours, a single heat treatment consumes less than 2 hours. What is important is that if a single heat treatment at the temperature of a silicon wafer from 500° to 900° C. requires less than 4 hours, though a length of time required to heat a silicon wafer from 500° to 900° C. may total more than 4 hours, then lattice defects will not noticeably appear in a silicon wafer which is later heat treated at a temperature of about 1050° C.

It may be concluded from the foregoing description that if, in case a single crystal silicon rod is pulled out of a silicon melt, the intracrystal temperature of the growing single crystal silicon rod is reduced from 900° to 500° C. in less than 4 hours, then the occurrence of lattice defects can be effectively suppressed during the manufacture of a semiconductor device.

It is further proved that 16 hour heat treatment at 1050° C. of a silicon wafer previously heat treated a long time at 450° C. gives rise to as little occurrence of lattice defects as in the case where a silicon wafer is heat treated only once 16 hours at 1050° C. This fact coincides with the aforesaid conclusion that lattice defects taking place at a temperature of 450° C. can not sustain themselves in a substantially stable condition.

Where the intracrystal temperature of a growing single crystal silicon rod is to be reduced from 900° to 500° C. in less than 4 hours, then it is advised to carry out cooling at a greater rate than 900−500/4×100° C./hr, if said cooling is to be effected at the fixed rate.

Figure 5:
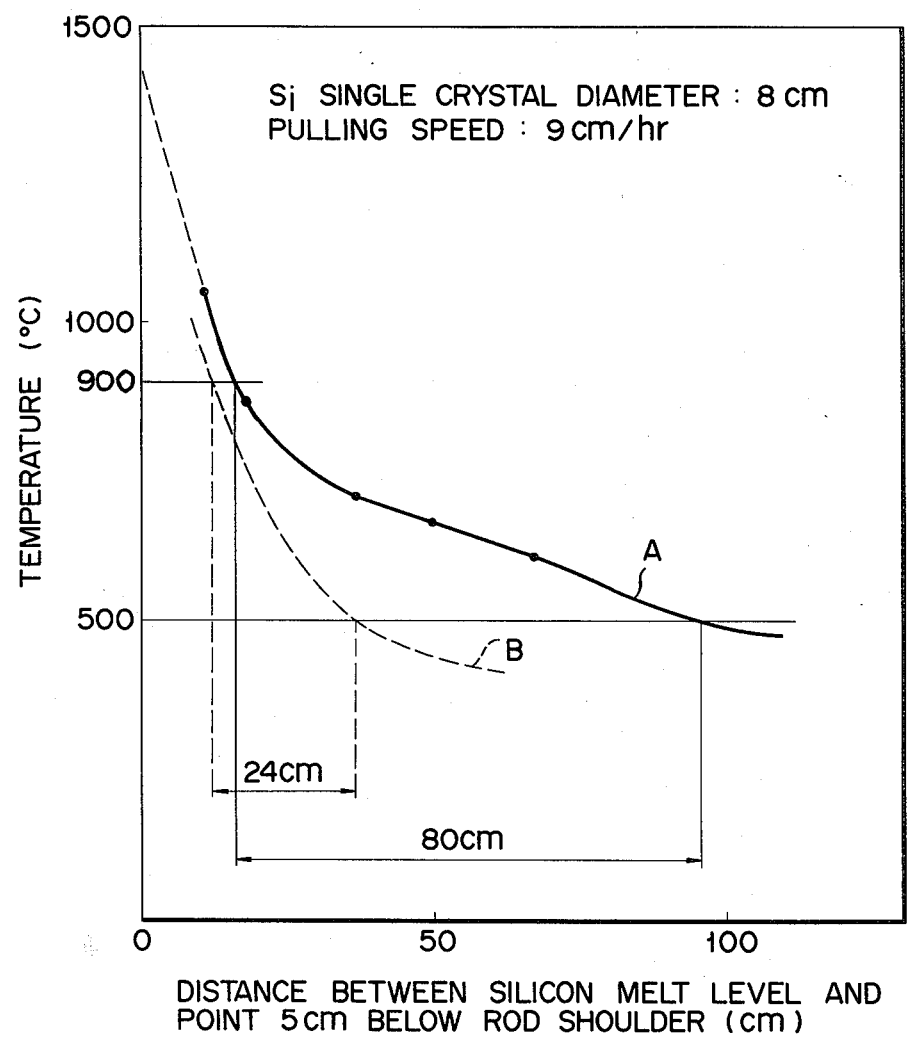

FIG. 5 indicates data obtained by measuring temperature changes occurring at a point 5 cm below the shoulder portion of a growing single crystal silicon rod having a diameter of 80 mm while it was pulled up from a silicon melt. The curves A and B represent data measured when the silicon rod was pulled up at a speed of 1.5 mm/min=9.0 cm/hr. In the case of the curve A, a distance between that portion of a silicon rod in the process of being pulled up which indicated a temperature of 900° C. and that portion of said silicon rod which stood at a temperature of 500° C. is 80 cm. Therefore, a length of time required for the silicon rod to be pulled up for the above-mentioned distance of 80 cm is 8.9 hours, if said pulling is undertaken at the aforesaid speed of 9.0 cm/hr. In the case of the curve B, a distance between that portion of a silicon rod in the process of being pulled up which indicated a temperature of 900° C. and that portion of said silicon rod which showed a temperature of 500° C. is 24 cm. Therefore, a length of time required for the silicon rod to be pulled up for the distance of 24 cm is 2.7 hours, if said pulling is carried out at the above-mentioned speed of 9.0 cm/hr. With the curve A, the intracrystal average temperature gradient of a silicon rod in the process of being pulled up is of the order of 5.0° C./cm. With the curve B, said temperature gradient is of the order of 16.7° C./cm. The average cooling rate is 45° C./hr for the curve A and 150° C./hr for the curve B.

The single crystal silicon rod sample I of FIG. 2 was formed of a silicon crystal corresponding to the curve A of FIG. 5. The single crystal silicon rod sample III of FIG. 2 was prepared from a silicon crystal corresponding to the curve B of FIG. 5. It is seen therefore from FIG. 5 that a single crystal silicon rod whose temperature is reduced from 900° to 500° C. in less than 4 hours while being pulled up does not indicate lattice defects when later heat treated long even at a temperature of 1050° C., thus proving adapted to be used as a raw material for the manufacture of the semiconductor device.

The curve A of FIG. 5 represents data obtained when the prior art pulling apparatus shown in FIG. 1 was applied. If an attempt is to be made to let the intracrystal temperature of a growing silicon rod be reduced from 900° to 500° C. in less than 4 hours, then the prior art apparatus has to be rearranged in order to increase the average cooling rate. Generally, it is fundamentally advised for elevation of the average cooling rate to accelerate the pulling speed of a growing silicon rod or to cause the intracrystal temperature of said silicon rod to be reduced at a sharp gradient.

Where a large size single crystal silicon rod is pulled up, the silicon rod is generally grown at the rate of 0.5 to 3 mm per minute. It is therefore advised to pull up the silicon rod at a rate falling within the range of said growing rate, that is, a larger rate than 1 mm/min. It is theoretically possible to apply a larger rate than said 1 mm/min to the growth or pullup of the silicon rod. A larger rate than 10 cm/min is actually, applied to for example, dendritic ribbon silicon crystal or another form of ribbon silicon crystal obtained by the edge defined film feed growth (abbreviated as "the EFG method"). Considering, however, the latent heat of crystallization occurring when a large size single crystal silicon rod having a large diameter of, for example 8 cm is pulled up, it is difficult to accelerate the growth or pull up of such silicon rod to a much higher level than the above-mentioned rate of 10 cm/min. Where, therefore, the pulling speed of a growing silicon rod is chosen to fall within the range of 0.5 to 3 mm per minute, and further it is desired to reduce the intracrystal temperature of the growing silicon rod from 900° to 500° C. in less than 4 hours, then it is necessary to set the intracrystal temperature gradient at a sharper form than 33.3° C./cm for the pulling speed of 0.5 mm/min and at a sharper form than 5.5° C./cm for the pulling speed of 3 mm/min.

Where a larger size single crystal silicon rod having a high temperature is quenched at a sharp temperature gradient, then it is known that the silicon crystal is destroyed, or in a less severe case, slips or dislocations arise in the silicon crystal. To prove such events, tests were made by cooling silicon rod samples from 900° to 400° C. at a temperature gradient ranging between 10° and 100° C./cm and at the rate of 50° to 200° C./hr. Where the single crystal silicon rod samples were cooled at the rate of 100° to 200° C./hr, the destruction of a silicon crystal or the slip of silicon crystal were substantially unnoticed even at a cooling temperature gradient of the order of 100° C./cm. Only the dislocations of the silicon crystal tended to become prominent. Where the silicon rod was cooled at a temperature gradient of 50° C./cm, then lattice defects were not observed at all. It is considered advisable from the above-mentioned test results to cool a silicon crystal rod at as sharp a temperature gradient of less than 100° C./cm or preferably less than 50° C./cm, in order to reduce the temperature of the growing silicon rod from 900° to 500° C. in less than 4 hours while said rod is pulled up at the customary speed.

As mentioned above, where it is desired to reduce the intracrystal temperature of a growing silicon rod from 900° to 500° C. in less than 4 hours, it is necessary to cool the silicon rod at a sharper temperature gradient than 5.5° C./cm even when the silicon rod is pulled up at a speed of 3 mm/min. Such sharp cooling temperature gradient can not be applied to the prior art apparatus for manufacturing a single crystal silicon rod. The object of cooling a silicon rod at a sharper temperature gradient than has been possible in the past has to be attained by taking the following steps with respect to, for example, a rod-pulling device;

(a) to shut off that portion of a silicon crystal rod which has been cooled to a lower level than 900° C. to as much radiant heat as possible that is being emitted from heat element or the walls of a crucible;

(b) to save a growing silicon crystal rod as much as possible from radiant heat issued from the surface of a silicon melt;

(c) to set a growing silicon crystal rod apart from a chamber in which the high temperature zone of an electric furnace is disposed;

(d) to directly impinge cooled protective gas on a growing silicon crystal rod;

(e) to wind a cooling tube around a growing silicon crystal rod; and (f) first to insert a growing silicon crystal rod into a thermostat maintained at 900° to 1000° C. and then, after the completion of the growth of said rod, quench the thermostat in a state shut off from radient heat from an electric furnace and a silicon melt.

Figure 6:
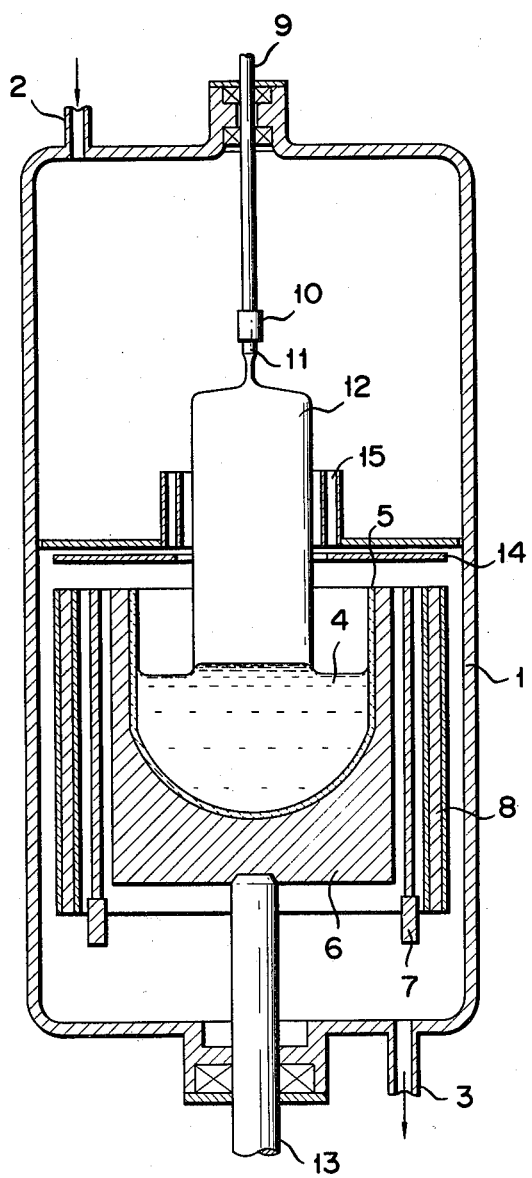
FIG. 6 is a sectional view of a single crystal silicon rod-manufacturing apparatus embodying this invention.

FIG. 6 illustrates an apparatus adapted to apply the method of this invention for reducing the intracrystal temperature of a growing silicon crystal rod from 900° to 500° C. in less than 4 hours.

The parts of FIG. 6 the same as those of FIG. 1 are denoted by the same numerals, description thereof being omitted. With the embodiment of FIG. 6, a growing single crystal silicon rod 12 is provided with a radiant heat shield 14 for shielding said rod 12 from radiant heat emitted from the high temperature zones of the apparatus such as a silicon melt 4, crucible 5 and graphite heater 7. A cooling tube 15 through which cooling water flows is set around the growing single crystal silicon rod 12. Application of the radiant heat shield 14 and cooling tube 15 enables the growing single crystal silicon rod 12 to be cooled from 900° to 500° C. at a sharp temperature gradient in less than 4 hours. It is possible to cool the silicon rod at a desired temperature gradient by applying only either the radiant heat shield 14 or the cooling tube 15.

What we claim is:

1. A method for manufacturing a single crystal silicon rod having a diameter of 80 mm or more comprising the steps of: pulling up a seed silicon crystal contacted by a silicon melt in an atmosphere of protective gas, lowering the temperature of said rod directly to about 900° C., reducing the susceptibility of said silicon rod to formation of dislocation by subsequent thermal treatments by then reducing the intracrystal temperature of the growing single crystal silicon rod from 900° C. to 500° C. in less than 4 hours and maintaining the intracrystal temperature gradient of said single crystal silicon rod at a value less than 100° C./cm.

2. The method according to claim 1, wherein the intracrystal temperature gradient is about 50° C./cm.

* * * * *